United States Patent
Iijima et al.

(10) Patent No.: US 7,261,941 B2
(45) Date of Patent: Aug. 28, 2007

(54) SHARP END, MULTI-LAYER CARBON NANO-TUBE RADIAL AGGREGATE AND METHOD OF MANUFACTURING THE AGGREGATE

(75) Inventors: Sumio Iijima, Aichi (JP); Masako Yudasaka, Ibaraki (JP); Akira Koshio, Mie (JP)

(73) Assignees: Japan Science and Technology Agency, Saitama (JP); NEC Corporation, Tokyo (JP)

(*) Notice: Subject to any disclaimer, the term of this patent is extended or adjusted under 35 U.S.C. 154(b) by 29 days.

(21) Appl. No.: 10/495,459

(22) PCT Filed: Nov. 5, 2002

(86) PCT No.: PCT/JP02/11516

§ 371 (c)(1),
(2), (4) Date: Jul. 7, 2004

(87) PCT Pub. No.: WO03/057620

PCT Pub. Date: Jul. 17, 2003

(65) Prior Publication Data

US 2005/0037150 A1    Feb. 17, 2005

(30) Foreign Application Priority Data

Jan. 8, 2002   (JP) ................... 2002-001810

(51) Int. Cl.
   *B32B 9/00*   (2006.01)
(52) U.S. Cl. .................... 428/408; 977/741
(58) Field of Classification Search .......... 428/408, 428/398, 392; 423/445 R; 977/DIG. 1; 29/595
See application file for complete search history.

(56) References Cited

U.S. PATENT DOCUMENTS 6,221,489 B1 * 4/2001 Morita et al. ............. 428/367
2003/0233871 A1 * 12/2003 Nguyen et al. ............ 73/105

FOREIGN PATENT DOCUMENTS

| JP | 07-061803 |   | 3/1995 |
| JP | 09-188509 |   | 7/1997 |
| JP | 2001-064004 | * | 3/2001 |

OTHER PUBLICATIONS

Iijima, S. et al.; Chem. Phys. Lett., vol. 309, pp. 165-170 (1999).
Tsang, S.C. et al., Nature, vol. 372, pp. 160-162 (1994).
Qin, L.C. et al., Nature, vol. 408, p. 50, (2000).
Zhao X. et al., Carbon, vol. 35, pp. 775-781 (1997).
Koshio, A. et al., Chem. Phys. Lett., vol. 356, pp. 595-600 (2002).

* cited by examiner

*Primary Examiner*—Jennifer McNeil
*Assistant Examiner*—Daniel Miller
(74) *Attorney, Agent, or Firm*—Wenderoth, Lind & Ponack, L.L.P.

(57) ABSTRACT

A method of manufacturing a acute tip, multi-wall carbon nanotube radial aggregate, comprising the steps of leading a graphite rod into plasma flame generated in a hydrogen-added inert gas atmosphere to evaporate carbon from the graphite rod and stacking, on the surface of the graphite rod, the acute tip, multi-wall carbon nanotube radial aggregation of novel carbon nano-structure useful as field emission electron sources such as probes for STM and APM, display elements, and displays.

7 Claims, 8 Drawing Sheets

(i)    (ii)    (iii)

(i)　　　　　　(ii)　　　　　(iii)

SHARP END, MULTI-LAYER CARBON NANO-TUBE RADIAL AGGREGATE AND METHOD OF MANUFACTURING THE AGGREGATE

TECHNICAL FIELD

The invention of the present application relates to a acute tip, multi-wall carbon nanotube radial aggregate and a method of producing the same. More specifically, the invention of the present application relates to a acute tip, multi-wall carbon nanotube radial aggregate, which is a novel carbon nano-structure useful as field emission electron sources such as probes for STM and AFM, display elements, and displays, a method of producing the same aggregate, a film of the acute tip, multi-wall carbon nanotube radial aggregate and a method of producing the same film.

BACKGROUND ART

Conventionally, a number of studies have been carried out in which a carbon nano-structure material such as a carbon nanotube, a carbon nanohorn or the like is used as a conductor of a micro-electronic element, an electrode of FPD or the like, a microstructure, an adsorbent made of a material having high strength, or the like.

Such a carbon nanotube as described above has a cylindrical shape obtained when a graphite sheet were to be rounded in a cylindrical shape. A carbon nanotube can be classified into a single-wall carbon nanotube having a single sheet and a multi-wall carbon nanotube in which a plurality of sheets are overlapped like a plurality of nests. A single-wall carbon nanotube of well known type generally has diameter of 1 to 2 nm and length of a few μm. In a multi-wall carbon nanotube, the diameter of the outermost layer thereof is generally tens of nm, the diameter of the innermost layer thereof is a few to 10 nm, and the length thereof is generally a few μm.

On the other hand, a carbon nanohorn represents a structure in which the tip end of a single-wall carbon nanotube is closed in a conical shape. In practice, such a carbon nanohorn is obtained as a carbon nanohorn aggregate in which a plurality of carbon nanohorns are radially aggregated with the conical tip ends thereof being oriented outward so as to form a spherical body whose diameter is approximately 100 nm.

Among such carbon nano-structures as described above, a multi-wall carbon nanotube has been discovered in which, although the diameter of the outermost layer thereof is 10 nm or so, carbon nanotubes are densely stacked in the multi-wall carbon nanotube to the core portion thereof and diameter of the innermost layer as the smallest tube is approximately 0.4 nm. The diameter of approximately 0.4 nm of the innermost layer of this multi-wall carbon nanotube is the smallest of the diameters of the relevant carbon nanotubes that have ever been discovered. Further, the aforementioned diameter of approximately 0.4 nm of the innermost layer of the multi-wall carbon nanotube substantially corresponds to the diameter of a molecule of the smallest fullerene ($C_{20}$). This means that the aforementioned diameter of the innermost layer has reached the ultimate smallness, a diameter smaller than which would not allow a carbon nanotube to exist in a stable manner. In other words, the multi-wall carbon nanotube having the aforementioned diameter of the innermost layer is a multi-wall nanotube in which tubes are densely stacked to a degree that no further inner tubes can be generated therein.

It is assumed that the above-described, densely stuffed multi-wall carbon nanotube has a characteristic that, in addition to being chemically stable like the conventional multi-wall carbon nanotube, the mechanical strength thereof has been significantly enhanced. Further, there has been revealed another interesting characteristic of the densely stuffed multi-wall carbon nanotube that the innermost carbon nanotube thereof having diameter of 0.4 nm has a metallic characteristic. The latter characteristic differs from the characteristic, observed in the conventionally obtained single-wall carbon nanotube whose diameter is 1 to 2 nm, that the conventional single-wall carbon nanotube may have either a metallic characteristic or a semiconductor-like characteristic, depending on the sequence of carbon atoms.

Thus, a carbon nano-structure, whose characteristic significantly changes by a slight change in the structure thereof, has potential as a material for various functions, which potential is not known yet. Further, it is expected that more carbon nano-structures of new types will be discovered in future.

The invention of the present application has been achieved in consideration of the above-described discoveries. An object of the present invention is to provide a acute tip, multi-wall carbon nanotube radial aggregate as a novel carbon nano-structure, which is useful as field emission electron sources such as probes for STM and AFM, display elements and displays, a method of producing the same aggregate, a film of the acute tip, multi-wall carbon nanotube radial aggregate and a method of producing the same film.

DISCLOSURE OF INVENTION

Thus, the invention of the present application provides the following invention which achieves the above-described object.

Specifically, in a first aspect of the invention of the present application, there is provided a acute tip, multi-wall carbon nanotube radial aggregate, characterized in that it includes a plurality of acute tip, multi-wall carbon nanotubes which each have one sharp, acute angled-end and are radially aggregated with the acute tips thereof being disposed outward.

Further, in a second aspect of the invention of the present application, the above-described acute tip, multi-wall carbon nanotube radial aggregate is characterized in that each acute tip, multi-wall carbon nanotube includes carbon nanotubes stacked therein to the core portion thereof. In a third aspect of the invention of the present application, the diameter of the innermost carbon nanotube of the acute tip, multi-wall carbon nanotube is approximately 0.4 nm. In a fourth aspect of the invention of the present application, the acute tip portion of the acute tip, multi-wall carbon nanotube has a conical shape and a tip-end angle of the acute tip portion is 40° or less. In a fifth aspect of the invention of the present application, the acute tip portion of the acute tip, multi-wall carbon nanotube has a conical shape and the apex of the cone is located at one of a position along the axis of the acute tip, multi-wall carbon nanotube, a position along an extension of the tube wall and a position therebetween. In a sixth aspect of the invention of the present application, the diameter of the aggregate is in a range of 1 to 5 μm.

Further, in a seventh aspect of the invention of the present application, a film of the acute tip, multi-wall carbon nanotube radial aggregate is characterized in that it includes a plurality of the acute tip, multi-wall carbon nanotube radial aggregates described in any of the aforementioned features, which aggregates are stacked to form a film-like shape. In an eighth aspect of the invention of the present application, the thickness of the film of the acute tip, multi-wall carbon nanotube radial aggregate is in a range of 20 to 150 μm.

Yet further, the invention of the present application provides, in a ninth aspect thereof, a method of producing a acute tip, multi-wall carbon nanotube radial aggregate, characterized in that it comprises the steps of: leading a graphite rod into plasma flame generated in a hydrogen-added inert gas atmosphere to evaporate carbon from the graphite rod; and stacking, on the surface of the graphite rod, the acute tip, multi-wall carbon nanotube radial aggregate.

In a tenth aspect of the invention of the present application, the method of producing a acute tip, multi-wall carbon nanotube radial aggregate further comprises the step of using radio frequency plasma of 4 MHz or more. In an eleventh aspect of the invention of the present application, the aforementioned method further comprises the step of setting the temperature at the core portion of the plasma flame at 5,000° C. or more. In a twelfth aspect of the invention of the present application, the aforementioned method further comprises the step of forming the tip end of the graphite rod in a conical shape. In a thirteenth aspect of the invention of the present application, the aforementioned method further comprises the step of leading the graphite rod into the plasma flame such that the tip end of the graphite rod is positioned at the core portion of the plasma flame. In a fourteenth aspect of the invention of the present application, the aforementioned method further comprises the step of, when the plasma flame has an ellipsoidal shape whose short axis is approximately 30 mm and long axis is approximately 60 mm, making the acute tip, multi-wall carbon nanotube radial aggregate stack on the surface of the graphite rod, which surface is 15 to 20 mm distanced from the core of the plasma. In a fifteenth aspect of the invention of the present application, the aforementioned method further comprises the step of adding 2 to 10% of hydrogen to the inert gas. In a sixteenth aspect of the invention of the present application, the aforementioned method further comprises the step of using Ar as the inert gas.

BRIEF DESCRIPTION OF DRAWINGS

FIGS. 1(i), 1(ii) and 1(iii) are views of showing examples of the tip-end shape of the acute tip, multi-wall carbon nanotube of the invention of the present application;

BEST MODE FOR CARRYING OUT THE INVENTION

The invention of the present application has the characteristics described above. An embodiment of the present invention will be described hereinafter.

First, a acute tip, multi-wall carbon nanotube radial aggregate provided by the invention of the present application is characterized in that the aggregate includes a plurality of acute tip, multi-wall carbon nanotubes which each have one sharp, acute-angled end and are radially aggregated with the acute tip portions thereof being disposed outward.

Figure 1:
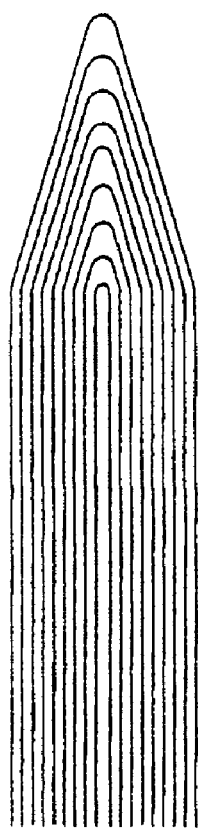
Figure 1:
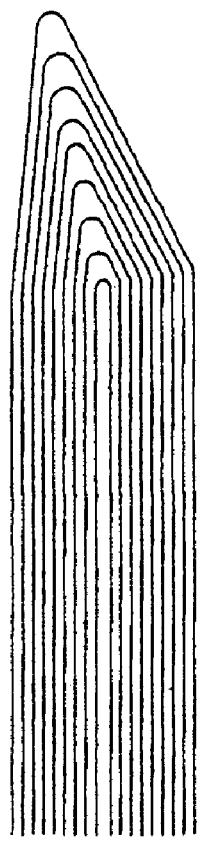
Figure 1:
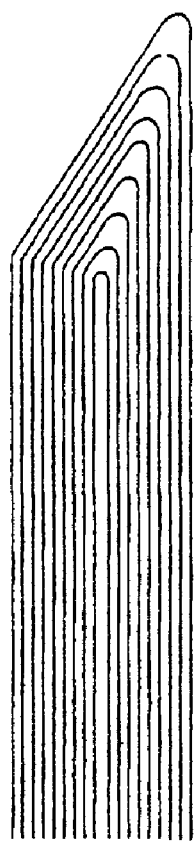

The acute tip, multi-wall carbon nanotubes of the acute tip, multi-wall carbon nanotube radial aggregate of the invention of the present application have uniform length of approximately 1 μm and the respective acute tip portions thereof have a conical shape whose tip-end angle is 40° or less. FIGS. 1(i) to 1(iii) are schematic, longitudinal sectional views showing examples of the acute tip portion of the acute tip, multi-wall carbon nanotube. More specifically, in the cone of the acute tip portion of the acute tip, multi-wall carbon nanotube, the angle formed between the axis and slope of the cone is approximately 20° or less. Accordingly, the acute tip portion has a conical shape whose an acute tip-end angle is 40° or less. More typically, the acute tip portion has a conical shape whose acute tip-end angle is 30° or less. The apex of the cone may be located at a position along the axis of the acute tip, multi-wall carbon nanotube as shown in FIG. 1(i), or a position along the extension of the tube wall as shown in FIG. 1(iii), or a position between that of FIG. 1(i) and FIG. 1(iii) as shown in FIG. 1(ii). That is, in the acute tip, multi-wall carbon nanotubes, the apexes of the cones thereof are located at various positions as described above in a mixed manner.

Further, surprisingly, in the acute tip, multi-wall carbon nanotube of the acute tip, multi-wall carbon nanotube radial aggregate of the invention of the present application, a large hollow is not generated at the core portion thereof and carbon nanotubes are densely stacked to the core portion. The diameter of the innermost carbon nanotube of the acute tip, multi-wall carbon nanotube is approximately 0.4 nm. This diameter of substantially 0.4 nm (or 0.4 nm including an measurement error) is equal to the diameter of the innermost layer or tube of the recently-reported, conventional multi-wall nanotube including densely stacked layers therein. In other words, the diameter of substantially 0.4 nm represents the smallest, lower limit diameter of a multi-wall carbon nanotube, no further inner tubes having diameter smaller than which can be formed therein. From this knowing, it is anticipated that the acute tip, multi-wall carbon nanotube radial aggregate of the present embodiment has unique properties.

The acute tip, multi-wall carbon nanotube radial aggregate includes the acute tip, multi-wall carbon nanotubes as described above, which nanotubes are radially aggregated with the acute tip portions thereof being disposed outward. Examples of the whole shape of the aggregate include a substantially spherical shape, a shape like a bunch of moss, and the like. With regards to the diameter (size) of the aggregate, the acute tip, multi-wall carbon nanotube radial aggregates having diameter in a range of approximately 1 to 5 µm have actually been realized. As is understood from the fact that the lengths of the respective acute tip, multi-wall carbon nanotubes are uniformly about 1 µm, the diameter (size) of the acute tip, multi-wall carbon nanotube radial aggregate is not dependent on the length of the aggregate, but increases as the number of the acute tip, multi-wall carbon nanotubes which are aggregated is increased.

The film of the acute tip, multi-wall carbon nanotube radial aggregate provided by the invention of the present application is characterized in that plural layers of the acute tip, multi-wall carbon nanotube radial aggregates are stacked therein to form a film-like shape. It is assumed from the results of observation that the thickness of the film of the acute tip, multi-wall carbon nanotube radial aggregate is in a range of approximately 20 to 150 µm, although the thickness varies depending on the stacked amount of the acute tip, multi-wall carbon nanotube radial aggregate. Further, a feature which is characteristic of the film of the acute tip, multi-wall carbon nanotube radial aggregate provided by the invention of the present application is that the film is not simple accumulation of particular bodies such as carbon nanohorns, but a stacked structure in which, on one acute tip, multi-wall carbon nanotube radial aggregate as a lower layer, another acute tip, multi-wall carbon nanotube radial aggregate as an upper layer is stacked as if the latter were "grown" on the former. Accordingly, it is assumed that, in the film of the acute tip, multi-wall carbon nanotube radial aggregate of the invention of the present application, the acute tip, multi-wall carbon nanotube radial aggregates are aggregated to have a film-like form, not by the van der Waals binding but by a force which is similar to a chemical bond.

The acute tip, multi-wall carbon nanotube radial aggregate and the film of the acute tip, multi-wall carbon nanotube radial aggregate of the invention of the present application as described above can be applied, for example, to a probe for a scanning probe microscope (SPM) represented by a scanning tunnel microscope (STM), an atomic force microscope (AFM) and the like, because the tip-end portion of the aggregate is sharp and the included angle of the tip is acute. Use of the single-wall carbon nanohorn or the like as such a probe has already been studied. However, a probe stronger than that of the single-wall carbon nanohorn can be realized by using the acute tip, multi-wall carbon nanotube radial aggregate because the acute tip, multi-wall carbon nanotube radial aggregate has a densely stuffed structure.

The above-described acute tip, multi-wall carbon nanotube radial aggregate according to the invention of the present application can be obtained, for example, by a method of producing the acute tip, multi-wall carbon nanotube radial aggregate according to the invention of the present application described below. Specifically, as exemplarily shown in FIG. 2, the acute tip, multi-wall carbon nanotube radial aggregate can be produced by leading a graphite rod (2) into plasma flame (1) generated in a hydrogen-added inert gas (4) atmosphere to evaporate carbon from the graphite rod and thereby stacking, on the surface of the graphite rod (2), the acute tip, multi-wall carbon nanotube radial aggregate (10).

In the invention of the present application, the plasma flame (1) for evaporating carbon is very important. In order to efficiently evaporate carbon, the temperature at the core portion of the plasma flame (1) is preferably 5000° C. or more. Further, for example, use of radio frequency plasma having frequency of 4 MHz or more is preferable because such radio frequency plasma is capable of maintaining stable plasma flame (1) even under a high gas pressure.

Hydrogen-added inert gas (4) is used as the atmosphere in which the plasma (1) is generated. Examples of a noble gas which can be used as the inert gas (4) include Ar (argon), He (helium), Ne (neon) and the like. Among these gases, Ar is preferably used because plasma flame can be generated in the most stable manner in argon. The concentration of hydrogen added to the inert gas (4) atmosphere may be set in a range of 2 to 10% or so, preferably about 10%.

In the invention of the present application, a sintered body or a porous body of carbon whose purity is 99% or more or so can be used as the graphite rod (2) as the raw material. If the purity of the graphite rod (2) is decreased below 99%, the content of impurities such as amorphous carbon increases, which is not preferable. No metal needs to be added, as a catalyst, to the graphite rod (2). With regards to shape of the graphite rod (2), the diameter, length and the like of the graphite rod (2) are not particularly restricted, as long as the tip end of the graphite rod (2) can be led to the plasma flame (1). Accordingly, the shape of the graphite rod (2) may optionally be changed in accordance with the plasma-generating device in use and the size of the plasma flame (1) generated by the device. For example, it is preferable that the graphite rod (2) has a diameter small enough to be led to the core portion of the plasma flame (1) at which core portion the temperature of the plasma flame (1) is highest. It is more preferable that the tip-end portion of the graphite rod (2) is shaped so as to have a conical shape like the tip portion of a pencil, so that evaporation of carbon is facilitated.

Figure 2:
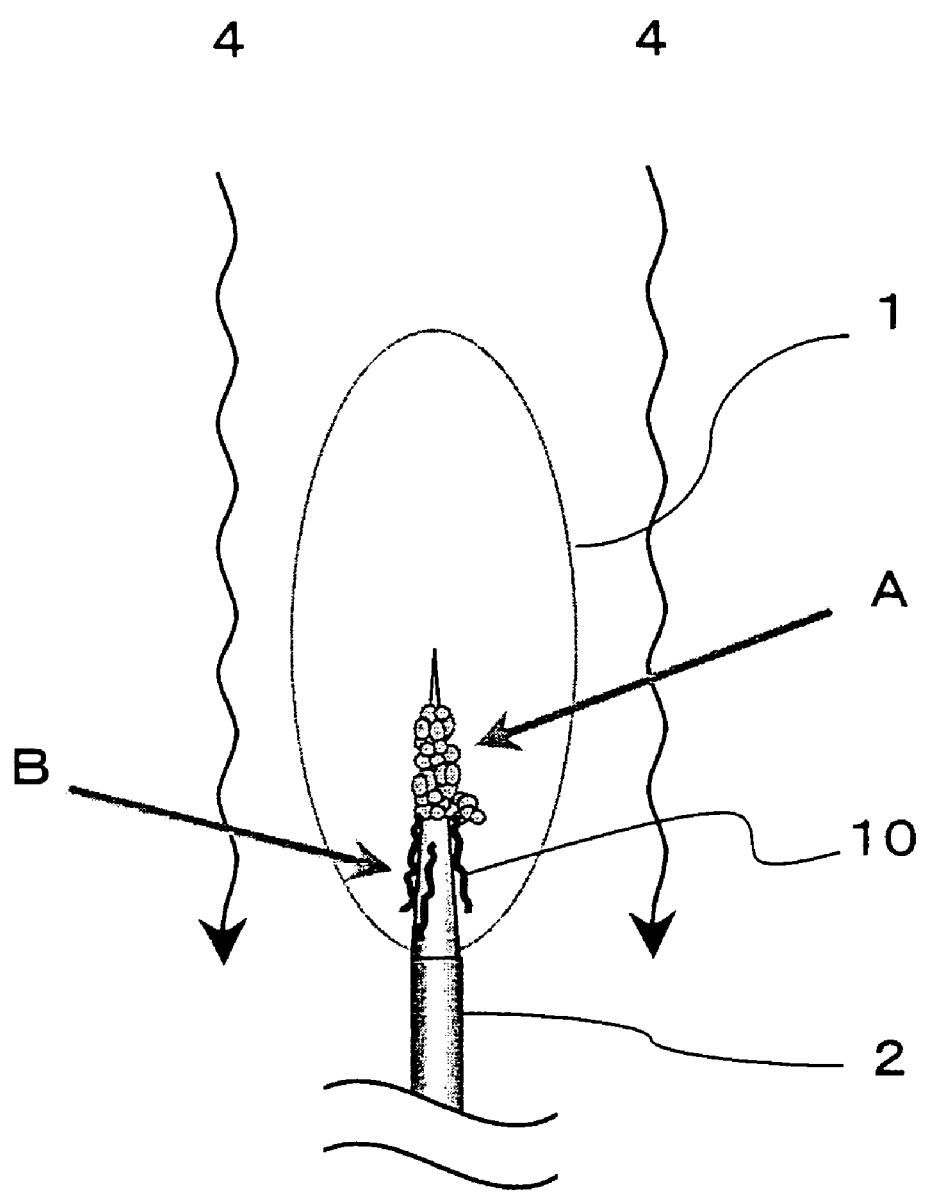
FIG. 2 is a view showing an example of the manner in which the acute tip, multi-wall carbon nanotube radial aggregate is obtained according to the method of the invention of the present application.

The graphite rod (2) as described above is led to the core portion of the plasma flame (1), so that carbon is evaporated. Some of the evaporated carbon is influenced by a flow of the carrier gas and, as a result, deposited or stacked on the surface of the graphite rod (2), which surface is slightly distanced from the core portion of the plasma flame (1). As shown in FIG. 2 with symbols A and B, the stacked substance (2) includes cotton-like substance A and film-like substance B. The acute tip, multi-wall carbon nanotube radial aggregate (10) can be obtained as the film-like substance B. More specifically, when the plasma flame (1) has, for example, an ellipsoidal shape whose short axis is approximately 30 mm and long axis is approximately 60 mm, the acute tip, multi-wall carbon nanotube radial aggregate (10) can be obtained as the film-like substance B at the surface of the graphite rod (2) which surface is approximately 15 to 30 mm distanced from the core portion of the plasma flame (1), or more specifically, at the surface of the graphite rod (2) which surface is approximately 15 to 20 mm distanced from the core portion of the plasma flame (1).

The acute tip, multi-wall carbon nanotube radial aggregate (10) is generated together with carbon fine particles such as amorphous carbon and stacked on the surface of the graphite rod (2). However, according to the method of the invention of the present application, the purity of the acute tip, multi-wall carbon nanotube radial aggregate (10) at the above-described position at the graphite rod (2) surface is 95% or more, which is extremely high. Further, as no metal catalyst or the like is used in the graphite rod (2) as the raw material, no impurities such as metal particles are mixed thereto.

As described above, according to the method of the invention of the present application, the acute tip, multi-wall carbon nanotube radial aggregate can be produced at a high purity. Therefore, the present invention is very useful for a study of various characteristics of the acute tip, multi-wall carbon nanotube radial aggregate, a study of application of such characteristics, and the like.

Hereinafter, the aforementioned embodiment of the present invention will be described more in detail by the following examples.

EXAMPLES

Figure 3:
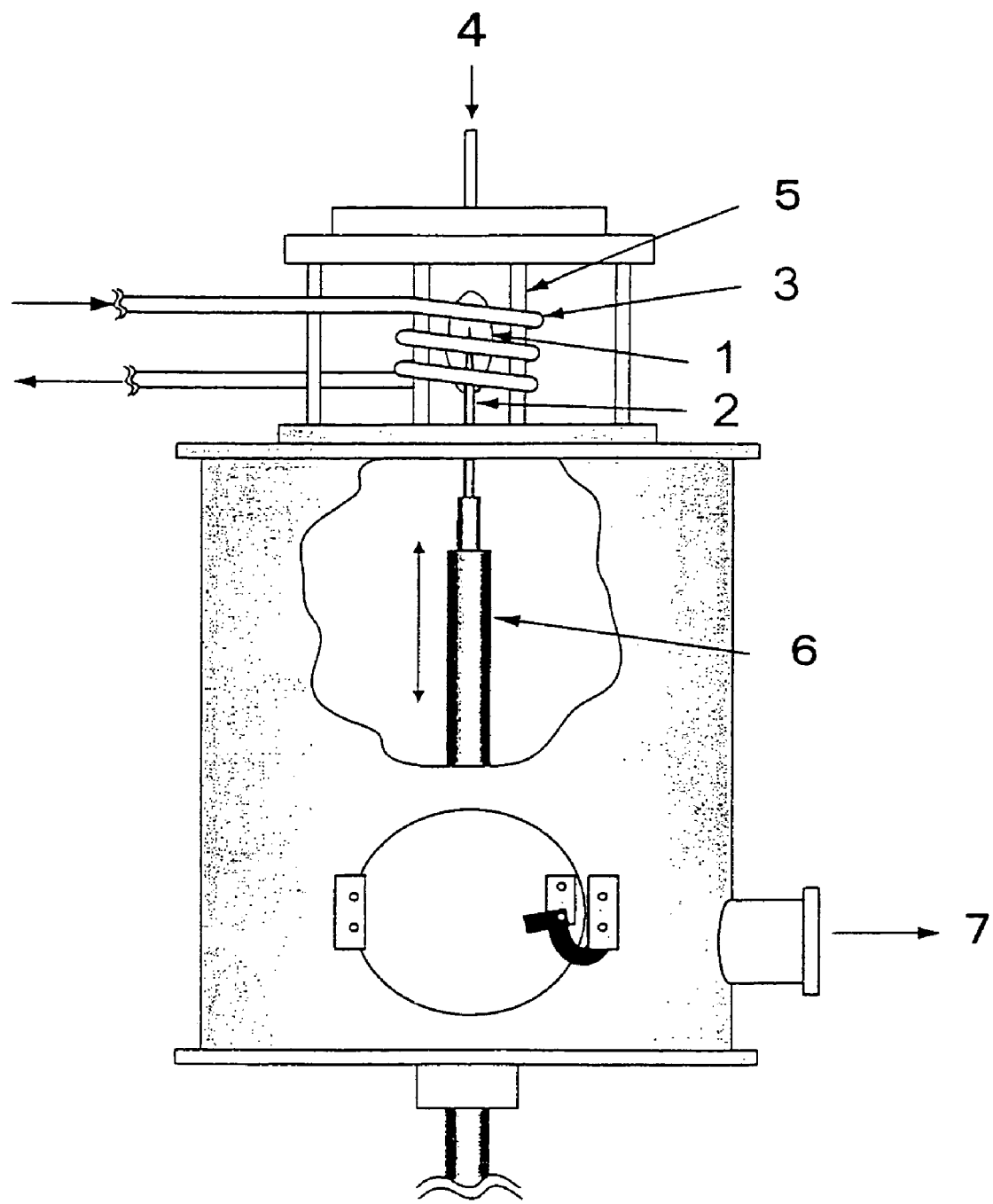
FIG. 3 is a view showing an example of a device for producing the acute tip, multi-wall carbon nanotube radial aggregate, used in an embodiment.

A acute tip, multi-wall carbon nanotube radial aggregate was produced by using a radio frequency plasma-generating device shown in FIG. 3. First, a hydrogen-added inert gas (4) was supplied to the inside of a quartz tube (5) and electric current of radio frequency (approximately 4 MHz) was applied to an induction coil (3) which was made of copper and wound around the outer periphery of the quartz tube (5), so that radio frequency plasma (1) was generated. Ar was used as the inert gas (4). Regarding the flow rate of Ar gas inside the quartz tube (5), the flow rate of the inner rotation gas which circulated inside the plasma (1) was set at 15 ml/min, the flow rate of the outer-radius gas which flowed straight at the outside of the plasma (1) was set at 15 ml/min, and the flow rate of the outer rotation gas which circulated outside the plasma (1) was set at 20 ml/min, so that the plasma flame (1) was maintained for a long time in a stable manner. Hydrogen was added to the Ar gas at the rate of 2 ml/min. The hydrogen-added inert gas (4) was discharged from a discharge port (7) by a rotary pump.

A graphite rod (2) was led to the core portion of the plasma flame (1) generated as described above, by using a graphite rod holder (6) which was movable in the vertical direction, to evaporate carbon. After approximately 15 minutes, a acute tip, multi-wall carbon nanotube radial aggregate having purity of 95% or more was obtained, as a film-like deposit, on the surface of the graphite rod which surface was approximately 15 to 20 mm distanced from the tip end of the graphite rod.

Figure 4:
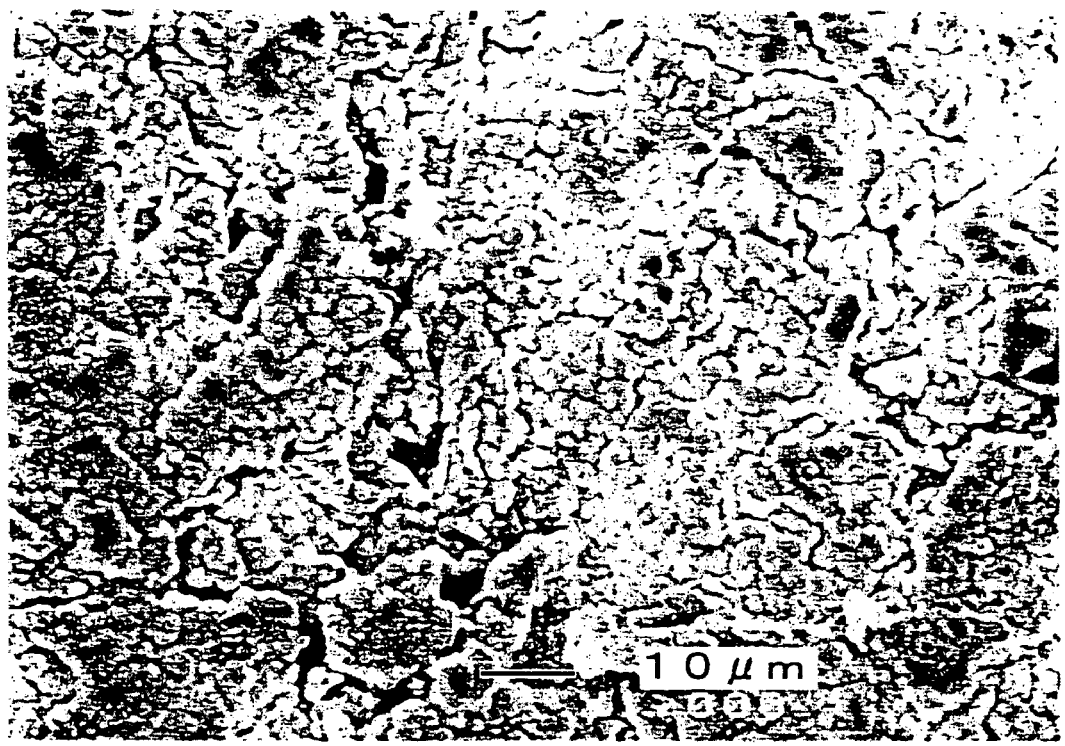
FIG. 4 is a view showing an image of a film of the acute tip, multi-wall carbon nanotube radial aggregate of the invention of the present application, observed by using a scanning electron microscope (SEM)
Figure 5:
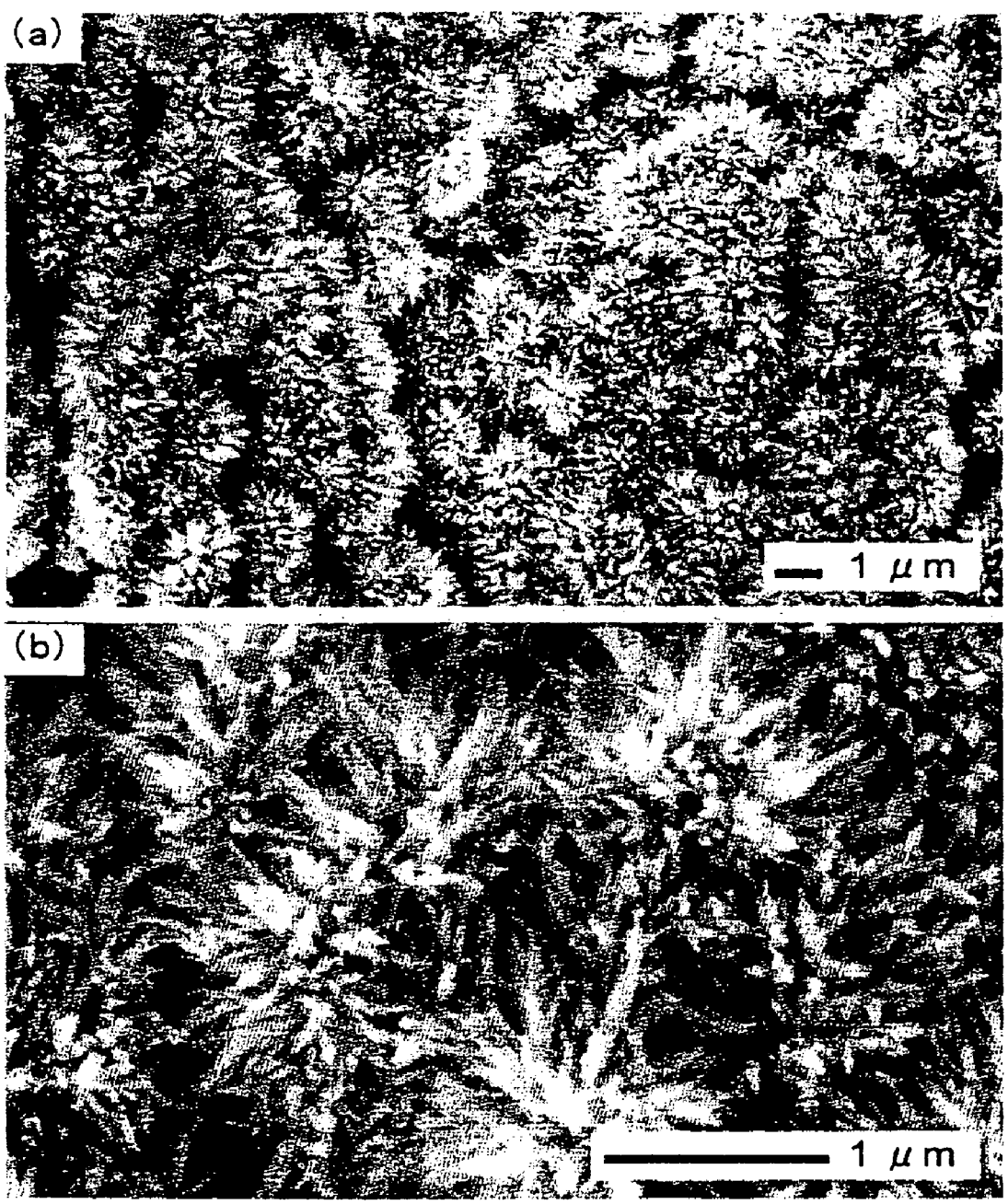
FIGS. 5(a) and 5(b) are views each showing an image of the acute tip, multi-wall carbon nanotube radial aggregate of the invention of the present application, observed by using a scanning electron microscope (SEM)

An image of the thus obtained film of the acute tip, multi-wall carbon nanotube radial aggregate, observed by using a scanning electron microscope (SEM), is shown in FIG. 4. An image of the acute tip, multi-wall carbon nanotube radial aggregate, observed by using a SEM, is shown in FIGS. 5(a) and 5(b), respectively. It was confirmed that the acute tip, multi-wall carbon nanotube radial aggregates were stacked in an overlapping manner to form a film of the acute tip, multi-wall carbon nanotube radial aggregate. Further, it was revealed that the acute tip, multi-wall carbon nanotube radial aggregate was constituted of a plurality of acute tip, multi-wall carbon nanotubes which had been radially aggregated.

Figure 6:
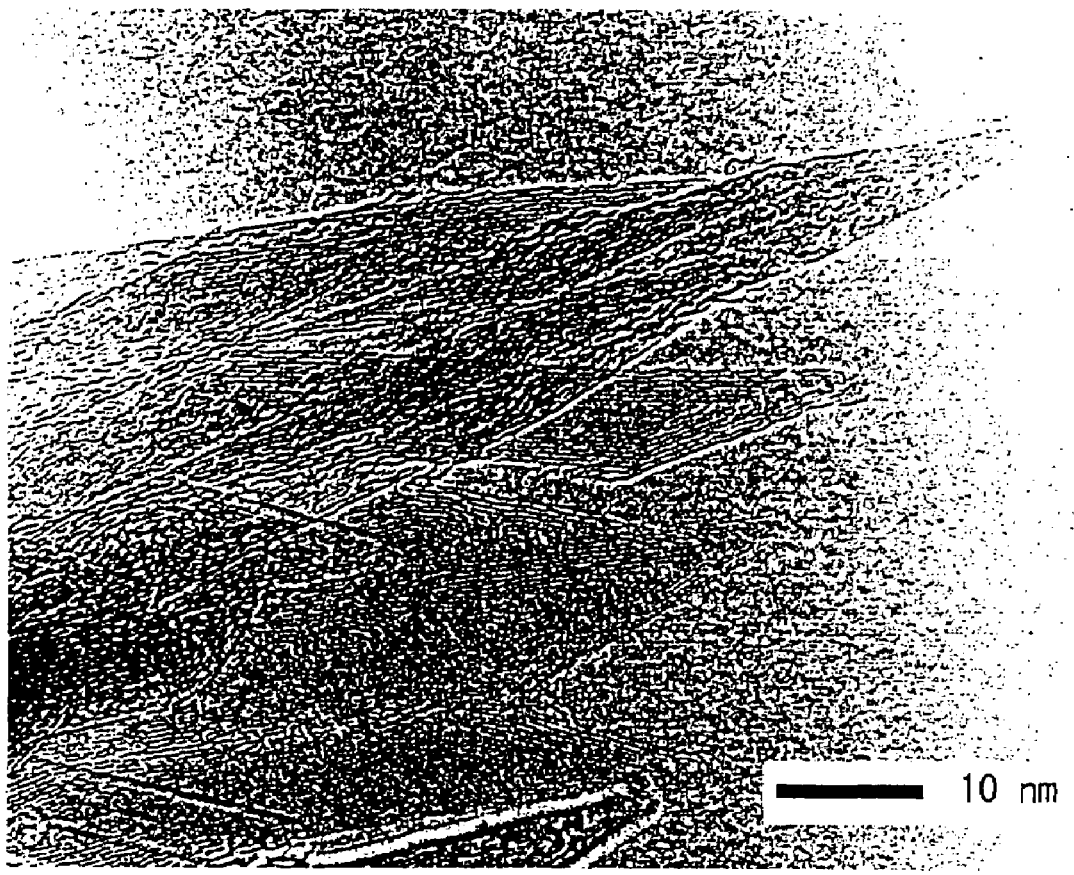
FIG. 6 is a photograph showing an image of the acute tip, multi-wall carbon nanotube radial aggregate of the invention of the present application, taken by using a transmission electron microscope (TEM)
Figure 7:
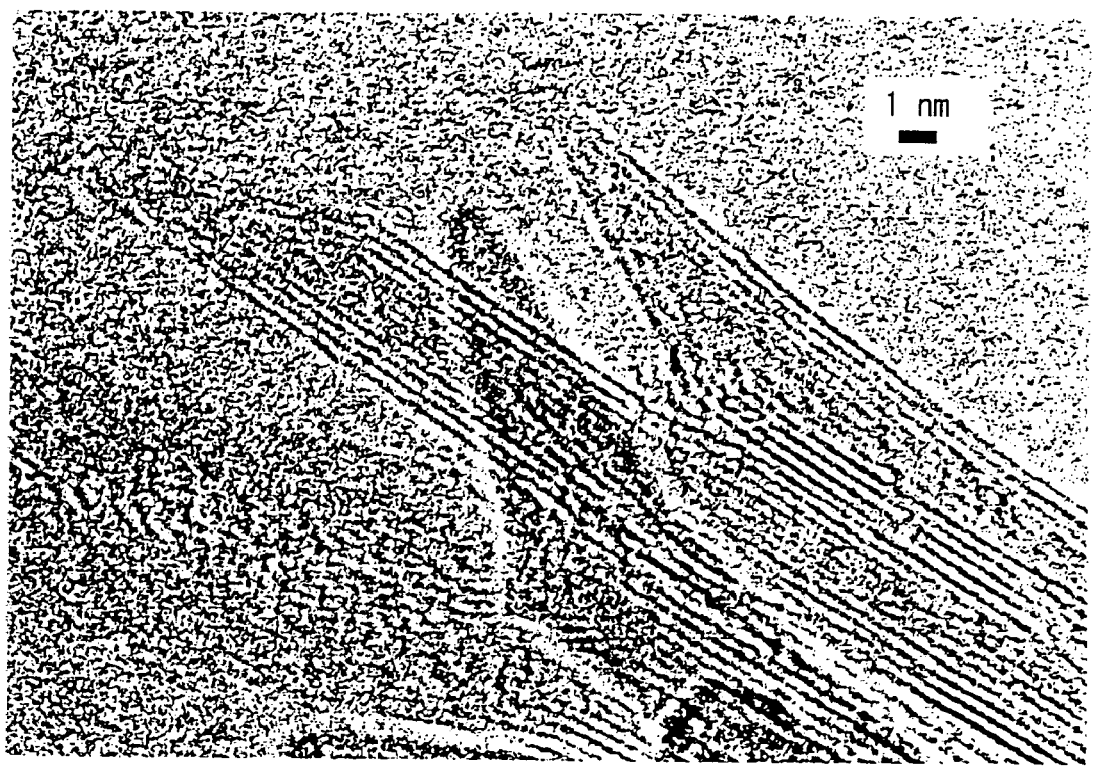
FIG. 7 is a photograph showing an image of the acute tip, multi-wall carbon nanotube radial aggregate of the invention of the present application, taken by using a transmission electron microscope (TEM)

Photographic images of the acute tip, multi-wall carbon nanotube radial aggregate, taken by using a transmission electron microscope (TEM), are shown in FIG. 6 and FIG. 7. By detailed observation, it was confirmed that the thus obtained acute tip, multi-wall carbon nanotube radial aggregate was an aggregation of the acute tip, multi-wall carbon nanotubes each having a conical tip end whose tip-end angle was approximately 30° and being radially aggregated with the tip-end portions thereof being oriented outward. Further, it was confirmed that each acute tip, multi-wall carbon nanotube was a multi-wall carbon nanotube in which approximately 10 to 20 graphite sheets were densely stacked to the core portion thereof and that the diameter of the outermost layer or tube of the multi-wall carbon nanotube was approximately 10 nm and the diameter of the innermost layer thereof was approximately 0.4 nm.

Figure 8:
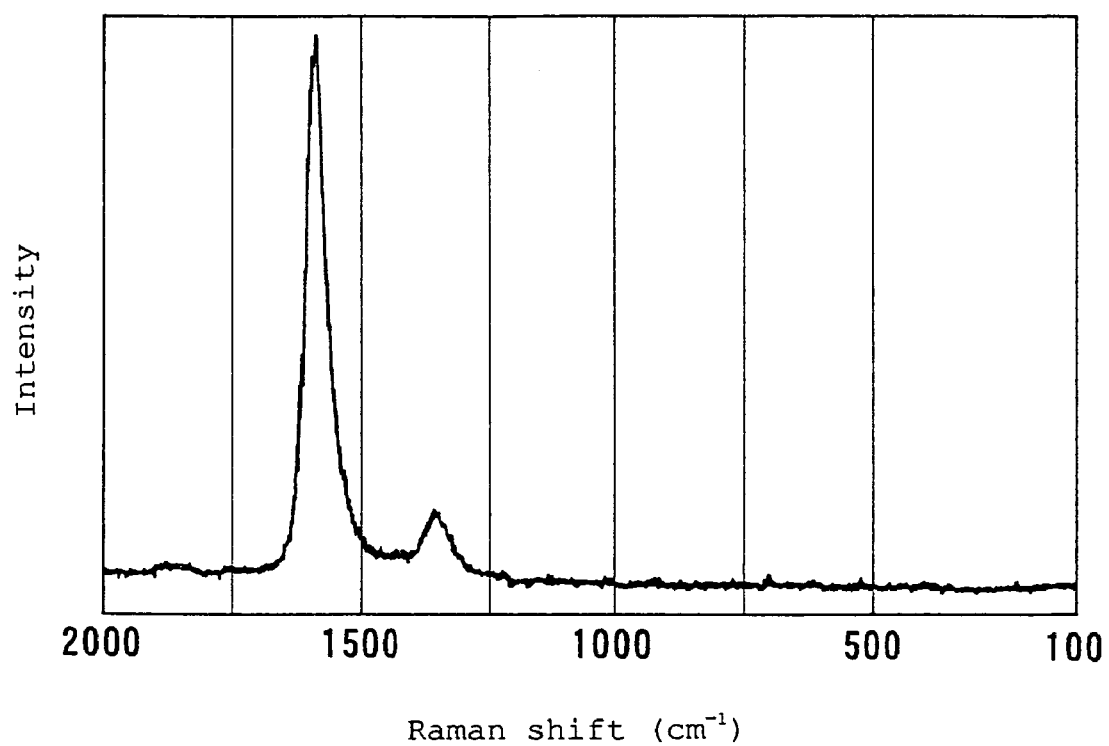
FIG. 8 is a view showing an example of Raman spectrum of the acute tip, multi-wall carbon nanotube radial aggregate of the invention of the present application.

FIG. 8 shows Raman spectrum of the thus obtained acute tip, multi-wall carbon nanotube radial aggregate. Two peaks derived from graphite were obtained. That is, it was confirmed that the acute tip, multi-wall carbon nanotube radial aggregate is formed of extremely pure graphite layers.

Needless to say, the present invention is not restricted to the above-described example and the various modifications of details thereof can be made.

INDUSTRIAL APPLICABILITY

As described above in detail, the present invention provides a acute tip, multi-wall carbon nanotube radial aggregate, which is a novel carbon nano-structure useful as field emission electron sources such as probes for STM and AFM, display elements, and displays, a method of producing the same aggregate, a film of the acute tip, multi-wall carbon nanotube radial aggregate and a method of producing the same film.

The invention claimed is:

1. An acute closed tip, multi-wall carbon nanotube radial aggregate, which includes a plurality of acute tip, multi-wall carbon nanotubes which each have one sharp, acute angled-end and are radially aggregated with the acute tip portion thereof being disposed outward.

2. The acute tip, multi-wall carbon nanotube radial aggregate described in claim 1 wherein the diameter of the innermost carbon nanotube of the acute tip, multi-wall carbon nanotube is approximately 0.4 nm.

3. The acute tip, multi-wall carbon nanotube radial aggregate described in claim 1, wherein the acute tip portion of the acute tip, multi-wall carbon nanotube has a conical shape and a tip-end angle of the acute tip portion is 40° or less.

4. The acute tip, multi-wall carbon nanotube radial aggregate described in claim 3, wherein the acute tip portion of the acute tip, multi-wall carbon nanotube has a conical shape and the apex of the cone is located at one of a position along the axis of the acute tip, multi-wall carbon nanotube, a position along an extension of the tube wall, and a position therebetween.

5. The acute tip, multi-wall carbon nanotube radial aggregate described in claim 1, wherein the diameter of the aggregate is in a range of 1 to 5 μm.

6. A film of acute tip, multi-wall carbon nanotube radial aggregate, which includes a plurality of the acute tip, multi-wall carbon nanotube, radial aggregates described in claim 1, which aggregates are stacked to form a film.

7. The film of acute tip, multi-wall carbon nanotube radial aggregate according to claim 6, wherein the thickness of the film of the acute tip, multi-wall carbon nanotube radial aggregate is in a range of 20 to 150 μm.

* * * * *